(12) United States Patent
Fong et al.

(10) Patent No.: US 10,784,433 B2
(45) Date of Patent: Sep. 22, 2020

(54) GRAPHENE-BASED SUPERCONDUCTING TRANSISTOR

(71) Applicant: RAYTHEON BBN TECHNOLOGIES CORP., Cambridge, MA (US)

(72) Inventors: Kin Chung Fong, Lexington, MA (US); Thomas A. Ohki, Arlington, MA (US)

(73) Assignee: Raytheon BBN Technologies Corp, Cambridge, MA (US)

( * ) Notice: Subject to any disclaimer, the term of this patent is extended or adjusted under 35 U.S.C. 154(b) by 0 days.

(21) Appl. No.: 16/351,443

(22) Filed: Mar. 12, 2019

(65) Prior Publication Data

US 2019/0288177 A1 Sep. 19, 2019

Related U.S. Application Data

(60) Provisional application No. 62/643,064, filed on Mar. 14, 2018.

(51) Int. Cl.
| | |
|---|---|
| *H01L 39/22* | (2006.01) |
| *H01L 39/02* | (2006.01) |
| *H01L 39/12* | (2006.01) |
| *H01L 27/18* | (2006.01) |

(52) U.S. Cl.
CPC .......... *H01L 39/228* (2013.01); *H01L 39/025* (2013.01); *H01L 39/12* (2013.01); *H01L 39/223* (2013.01); *H01L 27/18* (2013.01)

(58) Field of Classification Search
CPC . H01L 45/1253; H01L 51/56; H01L 51/0072; H01L 45/1233; H01L 51/5056
USPC ............................................................. 257/27
See application file for complete search history.

(56) References Cited

U.S. PATENT DOCUMENTS

| | | | | |
|---|---|---|---|---|
| 2011/0269629 | A1* | 11/2011 | Giustino | B82Y 30/00 505/100 |
| 2016/0372622 | A1* | 12/2016 | Fong | H01L 31/03044 |

OTHER PUBLICATIONS

Chen, W. et al. "Rapid Single Flux Quantum T-Flip Flop Operating up to 770 GHz", IEEE Transactions on Applied Superconductivity, Jun. 1999, pp. 3212-3215, vol. 9, No. 2, IEEE.
McCaughan, Adam N. et al., "A Superconducting-Nanowire Three-Terminal Electrothermal Device," Nano Letters, Sep. 3, 2014, pp. A-F, American Chemical Society Publications.

(Continued)

*Primary Examiner* — Andy Huynh
(74) *Attorney, Agent, or Firm* — Lewis Roca Rothgerber Christie LLP

(57) ABSTRACT

A transistor. In some embodiments, the transistor includes a first superconducting source-drain, a second superconducting source-drain, a graphene channel including at least a portion of a graphene sheet, and a conductive gate. The first superconducting source-drain, the second superconducting source-drain, and the graphene channel together form a Josephson junction having a critical current. The graphene channel forms a current path between the first superconducting source-drain and the second superconducting source-drain. The conductive gate is configured, upon application of a electric field across the conductive gate and the graphene channel by applying a voltage, to modify the critical current.

18 Claims, 3 Drawing Sheets

(56) References Cited

OTHER PUBLICATIONS

Volkmann, M. H. et al., "Implementation of energy efficient single flux quantum digital circuits with sub-aJ/bit operation", Superconductor Science and Technology, Nov. 8, 2012, pp. 1-16, IOP Publishing Ltd.

Walsh, Evan D. et aL, "Graphene-Based Josephson-Junction Single-Photon Detector," Physical Review Applied, Aug. 24, 2017, pp. 024022-1 through 024022-11, American Physical Society.

Wilhelm, Frank K et al., "Mesoscopic Superconducting-Normal Metal-Superconducting Transistor," Physical Review Letters, Aug. 24, 1998, pp. 1682-1685, vol. 81, No. 8, The American Physical Society.

\* cited by examiner

GRAPHENE-BASED SUPERCONDUCTING TRANSISTOR

CROSS-REFERENCE TO RELATED APPLICATION(S)

The present application claims priority to and the benefit of U.S. Provisional Application No. 62/643,064, filed Mar. 14, 2018, entitled "GRAPHENE-BASED SUPERCONDUCTING TRANSISTOR", the entire content of which is incorporated herein by reference.

FIELD

One or more aspects of embodiments according to the present invention relate to transistors, and more particularly to a graphene-based superconducting transistor.

BACKGROUND

The processing power of a processing unit (e.g., a central processing unit (CPU)) in a computer may be limited by various factors, such as the size of the die or "chip" on which the processing unit is fabricated, the density of transistors in the processing unit, and the maximum switching speed of transistors in the processing unit. In large, high-density processing units, power dissipation may be the limiting factor. Each time a transistor is switched on or off, a certain amount of energy may be dissipated, so that a circuit with a number of densely packed transistors, switching at a high rate, may dissipate a significant amount of power per unit area. Technological limitations on techniques for extracting heat from the chip, and on the maximum safe operating temperature of the transistors, may therefore limit the number of switching operations that may be performed, per unit chip area per unit time. Thus, there is a need for a transistor capable of operating with reduced power consumption.

SUMMARY

In some embodiments of the present disclosure, there is provided a transistor including: a first superconducting source-drain, a second superconducting source-drain, a graphene channel including at least a portion of a graphene sheet, and a conductive gate, the first superconducting source-drain, the second superconducting source-drain, and the graphene channel together forming a Josephson junction having a critical current, the graphene channel forming a current path between the first superconducting source-drain and the second superconducting source-drain, and the conductive gate being configured, upon application of a voltage across the conductive gate and the graphene channel, to modify the critical current.

In some embodiments, the transistor further includes a graphene sandwich including: a first layer of hexagonal boron nitride immediately adjacent a first surface of the graphene sheet, the graphene sheet, and a second layer of hexagonal boron nitride immediately adjacent a second surface of the graphene sheet.

In some embodiments, each of the first layer of hexagonal boron nitride and the second layer of hexagonal boron nitride has a thickness greater than 0.3 nm and less than 100 nm.

In some embodiments, the conductive gate is directly on the graphene sandwich.

In some embodiments, the transistor further includes a gate insulating layer directly on the graphene sandwich, the conductive gate being directly on the gate insulating layer.

In some embodiments, the gate insulating layer is composed of aluminum oxide.

In some embodiments, the transistor further includes a substrate, the first superconducting source-drain, the second superconducting source-drain, and the graphene sandwich being on the substrate.

In some embodiments, the substrate is a silicon substrate.

In some embodiments, the substrate is a float zone crystalline silicon substrate.

In some embodiments, the graphene sheet has an electron mobility of more than 100,000 cm2/V/s.

In some embodiments, the graphene sheet substantially has the shape of a rectangle, the rectangle having a length and a width, the length being less than or equal to the width.

In some embodiments, the length of the rectangle is less than 0.5 microns and the width of the rectangle is greater than 0.5 microns.

In some embodiments, the length of the rectangle is between 0.1 microns and 0.3 microns, and the width of the rectangle is between 0.7 microns and 2.5 microns.

In some embodiments, the graphene sheet consists of a single atomic layer of graphene.

In some embodiments, the graphene sheet includes two atomic layers of graphene.

In some embodiments, the first superconducting source-drain and the second superconducting source-drain are composed of a material selected from the group consisting of niobium nitride, niobium titanium nitride, niobium diselenide, aluminum, niobium, niobium titanium, and lead.

In some embodiments, a system includes a transistor and further includes a refrigerator configured to cool the graphene sheet to a temperature below 4 K.

In some embodiments, the refrigerator is a pulse tube refrigerator.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a graphene-based superconducting transistor provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1A:
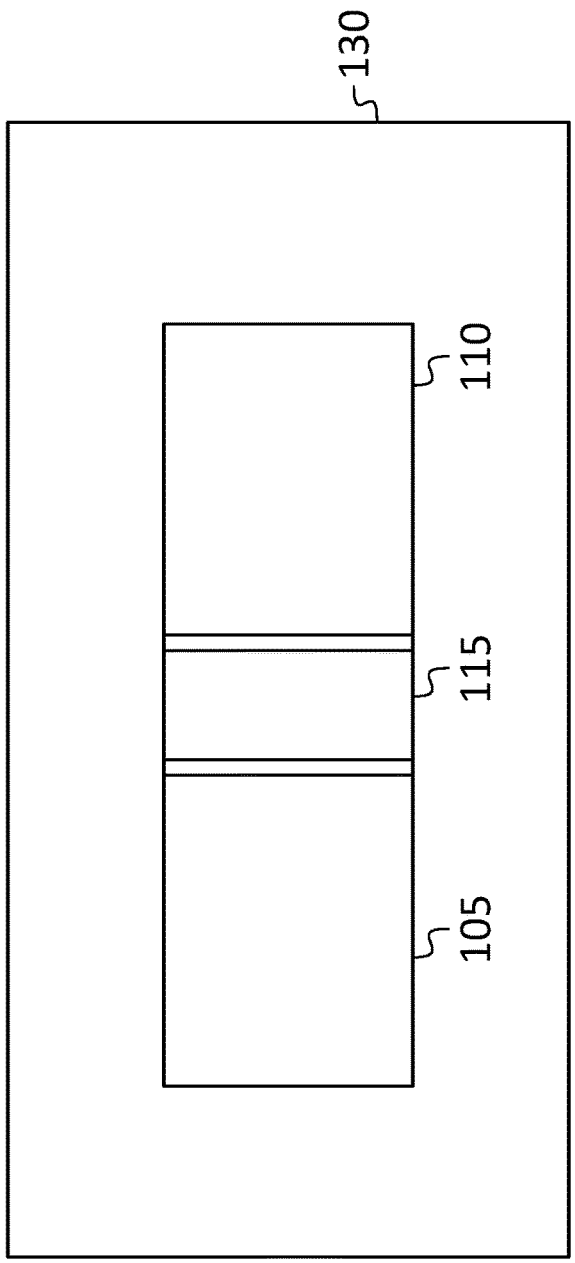
FIG. 1A is a top view of a graphene-based superconducting transistor, according to an embodiment of the present invention.
Figure 1B:
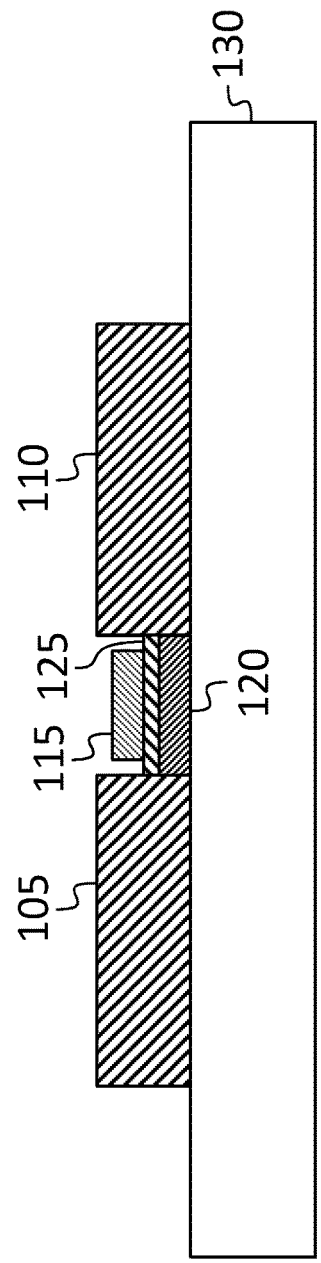
FIG. 1B is a side view of a graphene-based superconducting transistor, according to an embodiment of the present invention.

FIGS. 1A and 1B are a schematic top view and side view of a graphene-based superconducting transistor according to some embodiments. The transistor has a first superconducting current carrying terminal (which may be referred to as a first "superconducting source-drain") 105, a second superconducting current carrying terminal (which may be referred to as a second "superconducting source-drain") 110, and a conductive gate 115. As used herein, a "source-drain" is a current carrying terminal of a transistor; for example, for a field effect transistor for which the source and drain are structurally distinct, the source is a source-drain and the drain is also a source-drain. As used herein, a "superconducting source-drain" is a source drain composed of a material that behaves as a superconductor under suitable conditions, e.g., at sufficiently low temperature and current density. As such, the source-drains of the graphene-based superconducting transistor of FIGS. 1A and 1B may be referred to as superconducting source-drains regardless of whether the transistor is at sufficiently low temperature for the source-drains to be superconducting.

The first superconducting source-drain 105 and the second superconducting source-drain 110 may each be composed of any of a number of materials known in the art that become superconductive at low temperatures, including niobium nitride, niobium titanium nitride, niobium diselenide, molybdenum rhenium alloy, aluminum, niobium, niobium titanium, or lead.

Figure 2:
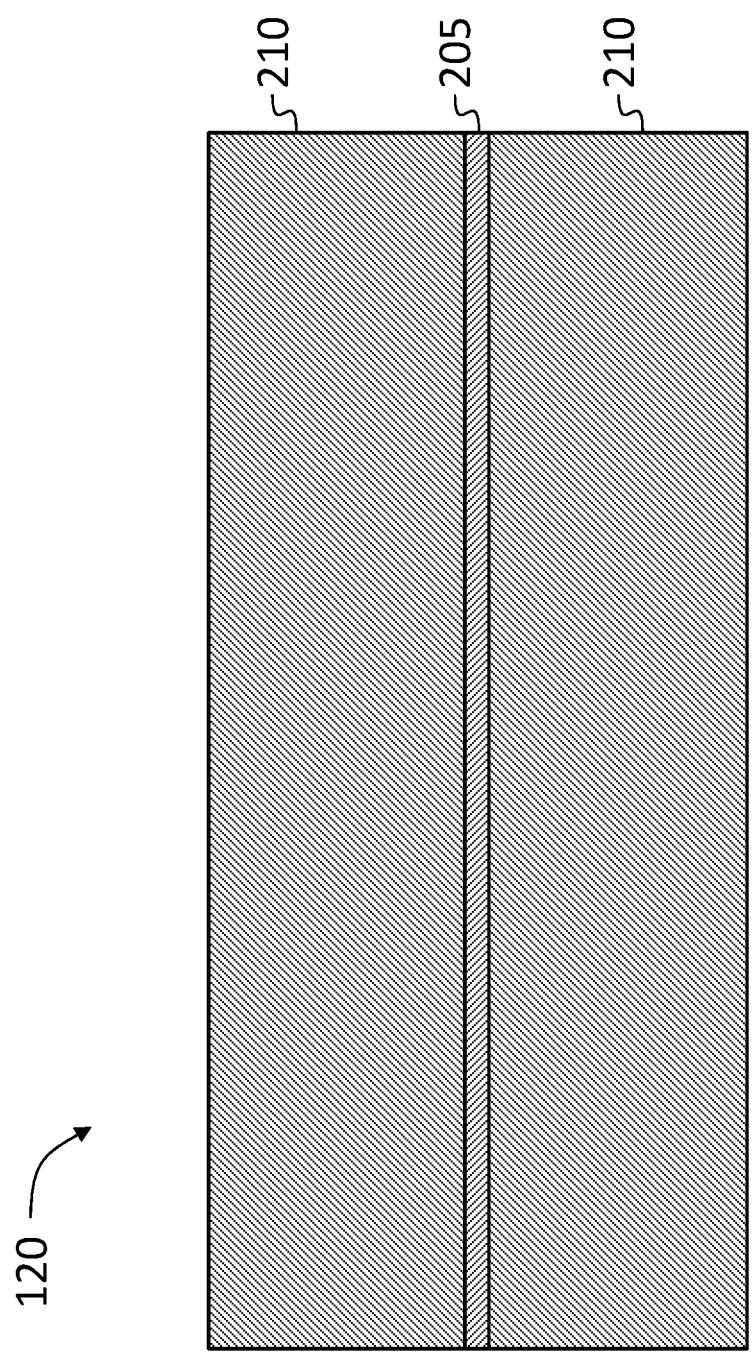
FIG. 2 is an enlarged view of a graphene sandwich, according to an embodiment of the present invention.

In some embodiments, a graphene sheet forms a channel of the graphene-based superconducting transistor. The graphene sheet may be part of a graphene sandwich 120, an enlarged view of a portion of which is shown in FIG. 2. The graphene sandwich 120 may include the graphene sheet 205, between two insulating layers 210, e.g., between two layers of hexagonal boron nitride. The graphene sheet 205 may consist of one, two, three, four, or as many as ten atomic layers of graphene. Each layer 210 of hexagonal boron nitride may be between 0.3 nm and 100 nm thick; the layers 210 of hexagonal boron nitride may keep the surface of the graphene sheet 205 clean, i.e., they may prevent surface contamination from compromising the properties of the graphene sheet 205.

Each hexagonal boron nitride layer 210 may be a single crystal, with an atomically flat surface facing the graphene sheet 205. Each hexagonal boron nitride layer 210 may be annealed, e.g., at 250° C. for 10-15 minutes, before the sandwich is assembled. The sandwich may be formed by first bringing a first layer 210 of hexagonal boron nitride into contact with the graphene sheet 205, resulting in adhesion of the graphene sheet 205 to the hexagonal boron nitride by van der Waals forces, and then bringing the graphene sheet 205, on the first layer 210 of hexagonal boron nitride, into contact with the second layer 210 of hexagonal boron nitride, resulting in adhesion, again by van der Waals forces, at the interface between the graphene sheet 205 and the second layer 210 of hexagonal boron nitride. The edges of the sandwich may then be etched, e.g. using plasma etching, so that the edges of the two layers 210 of hexagonal boron nitride and the edges of the graphene sheet 205 in the structure remaining after the etch process coincide (i.e., are aligned). In some embodiments, the graphene sheet is kept sufficiently clean during fabrication of the graphene sandwich 120, and thereafter by the protective layers 210 of hexagonal boron nitride, that the the graphene sheet has an electron mobility of more than 100,000 $cm^2/V/s$.

In some embodiments the first superconducting source-drain 105 and the second superconducting source-drain 110 make contact with respective (e.g., opposite) edges of the graphene sheet 205 by abutting against respective edges of the graphene sandwich 120 as shown, or, in other embodiments, by extending up onto the top surface of the graphene sandwich 120 (e.g., by being deposited, onto the graphene sandwich 120, as a patch extending across the edge of the graphene sandwich 120) so that respective vertical or steeply inclined portions, of the first superconducting source-drain 105 and of the second superconducting source-drain 110, are in contact with an edge of the graphene sheet 205 or in sufficiently close proximity with the graphene sheet 205 that electrons may be conducted between the graphene sheet 205 and the first superconducting source-drain 105, and between the graphene sheet 205 and the second superconducting source-drain 110, by tunneling across the gaps between the graphene sheet 205 and the first superconducting source-drain 105, and between the graphene sheet 205 and the second superconducting source-drain 110.

As used herein, a "graphene channel" is a graphene sheet, or a portion of a graphene sheet, that forms a conductive path between two source-drains of a transistor. The conductive path may include one or more gaps, e.g., a gap between each source-drain and the graphene sheet, across which electrons may be conducted by tunneling.

Referring again to FIG. 1B, in some embodiments a gate insulating layer 125, e.g., a layer of aluminum oxide, hafnium oxide, or an additional, separately formed, layer of hexagonal boron nitride, may be between the conductive gate 115 and the graphene sandwich 120.

The graphene-based superconducting transistor of FIGS. 1A and 1B is formed, in some embodiments, by placing the graphene sandwich 120 on a substrate 130, depositing the first superconducting source-drain 105 and the second superconducting source-drain 110 on the substrate 130 (and onto the graphene sandwich 120, if they overlap onto the graphene sandwich 120), depositing the gate insulating layer 125 (if it is present) on the graphene sandwich 120, and depositing the conductive gate 115 onto the gate insulating layer 125 (or, if the gate insulating layer 125 is absent, directly onto the graphene sandwich 120).

Contacts to external circuitry may be formed, for example, by forming wire bonds to the first superconducting source-drain 105, to the second superconducting source-drain 110 and to the conductive gate 115. In some embodiments, the deposition steps are performed in a different order, to similar effect.

In some embodiments a plurality of transistors, or one or more transistors and one or more other elements, may be fabricated on a single substrate 130. The substrate 130 may be a silicon substrate 130, and it may be selected for low conductivity, to reduce interactions between the active elements of the graphene-based superconducting transistor and the substrate 130. The substrate may be composed, for example, of highly resistive crystalline silicon having a low doping level, such as float zone silicon.

In operation, the graphene-based superconducting transistor may behave, when the conductive gate 115 is at the same potential, or at substantially the same potential, as the first superconducting source-drain 105 and as the second superconducting source-drain 110, as a Josephson junction, forming a superconducting connection (with no voltage drop) between the first superconducting source-drain 105 and the second superconducting source-drain 110 when the current flowing between the first superconducting source-drain 105 and the second superconducting source-drain 110 is less than a critical current of the Josephson junction, and forming a normal connection between the first superconducting source-drain 105 and the second superconducting source-drain 110 when the current exceeds the critical current of the Josephson junction.

The normal connection between the first superconducting source-drain 105 and the second superconducting source-drain 110 may have a resistance (that may be referred to as the "normal state resistance" ($R_n$), and a corresponding voltage drop may be present across the first superconducting source-drain 105 and the second superconducting source-drain 110 when the Josephson junction is in the normal state (i.e., when the current flowing between the first superconducting source-drain 105 and the second superconducting source-drain 110 is greater than the critical current of the Josephson junction). In this state, the voltage drop across the first superconducting source-drain 105 and the second superconducting source-drain 110 may be equal to the product of (i) the normal state resistance and (ii) the current flowing between the first superconducting source-drain 105 and the second superconducting source-drain 110.

In operation, a voltage may be applied to the conductive gate 115 of the graphene-based superconducting transistor, affecting the current flowing between the first superconducting source-drain 105 and the second superconducting source-drain 110, or the voltage across the first superconducting source-drain 105 and the second superconducting source-drain 110, or both, depending on the external circuit connected to the first superconducting source-drain 105 and the second superconducting source-drain 110.

Figure 3:
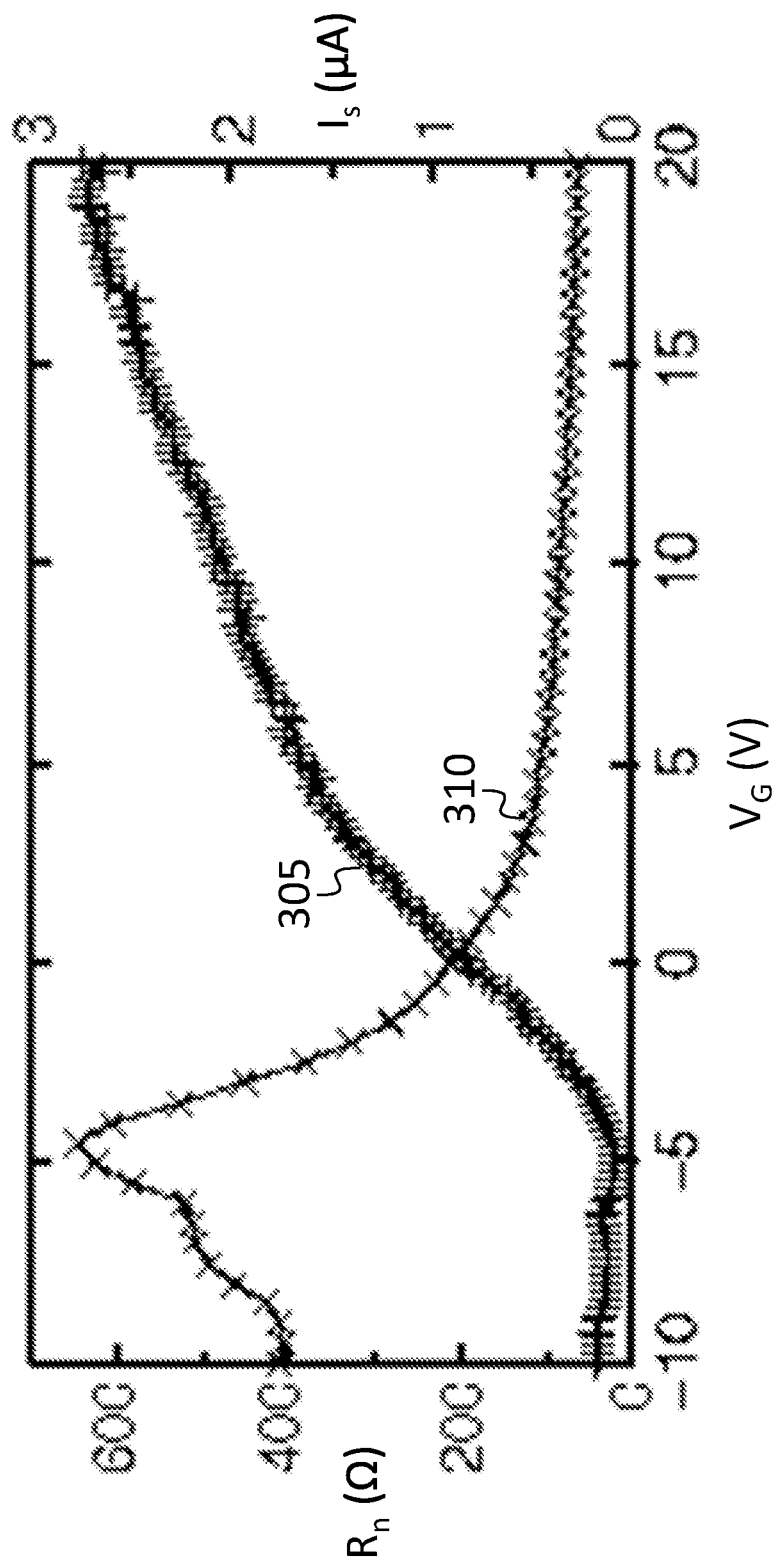
FIG. 3 is a graph of electrical characteristics, according to an embodiment of the present invention.

FIG. 3 shows, in a first curve 305, the critical current ($I_s$) of the Josephson junction as a function of the voltage across the conductive gate 115 and the graphene channel. As used herein, the "potential of the graphene channel" is defined to be the average of (i) the potential of the first superconducting source-drain 105 at the junction between the first superconducting source-drain 105 and the graphene sheet 205, and (ii) the potential of the second superconducting source-drain 110 at the junction between the second superconducting source-drain 105 and the graphene sheet 205. As used herein, the "voltage across the conductive gate 115 and the graphene channel" is defined as the difference between the potential of the conductive gate 115 and the potential of the graphene channel.

It may be seen from the first curve 305 of FIG. 3 that the critical current of the Josephson junction decreases as the difference between the potential of the conductive gate 115 and the potential of the graphene channel (i.e., the result of subtracting the potential of the graphene channel from the potential of the conductive gate 115) is decreased, reaching a value of nearly zero when the difference between the potential of the conductive gate 115 and the potential of the graphene channel reaches a value of about −5 V.

FIG. 3 also shows, in a second curve 310, the normal state resistance of the graphene-based superconducting transistor as a function of the voltage across the conductive gate 115 and the graphene channel. It may be seen from the second curve 310 of FIG. 3 that the normal state resistance increases as the difference between the potential of the conductive gate 115 and the potential of the graphene channel is decreased, reaching a peak of about 650 ohms when the difference between the potential of the conductive gate 115 and the potential of the graphene channel reaches a value of about −5 V.

Both the effect evidenced by the first curve 305 of FIG. 3, and the effect evidenced by the second curve 310 of FIG. 3, may tend to decrease the current flowing between the first superconducting source-drain 105 and the second superconducting source-drain 110 as the difference between the potential of the conductive gate 115 and the potential of the graphene channel is decreased. As such, the graphene-based superconducting transistor may be employed as a switch (e.g., in a binary logic circuit), with an "on" state in which the difference between the potential of the conductive gate 115 and the potential of the graphene channel is relatively high (e.g., greater than 0 V or greater than +5 V), and an "off" state in which the difference between the potential of the conductive gate 115 and the potential of the graphene channel is relatively low (e.g., less than −5 V).

For example, the transistor may be connected to a bias circuit that drives a bias current of 1.2 microamperes through the current path between the first superconducting source-drain 105 and the second superconducting source-drain 110. When the voltage across the conductive gate 115 and the graphene channel is greater than about +5 V, the bias current (of 1.2 microamperes) is less than the critical current of the Josephson junction (which is about 1.7 microamperes, when the voltage across the conductive gate and the graphene channel is +5 V), and the transistor is in the on (superconducting) state. When the voltage on the conductive gate 115 is less, e.g., 0 V, or −5 V, the bias current exceeds the critical current of the Josephson junction (which is about 0.8 microamperes or less, when the voltage across the conductive gate and the graphene channel is 0 V or less), and the transistor is in the off (normal) state.

In some embodiments, the distance L between the superconductors (FIG. 1A) (or the "channel length" is about 200 nm (e.g., it is between 100 nm and 1000 nm) and the channel width W is about 1.5 microns (e.g., it is between 0.5 microns and 10 microns). A graphene-based superconducting transistor with such dimensions may have characteristics such as those shown in FIG. 3, in some embodiments. Increasing or decreasing the channel width may result in the critical current increasing or decreasing by about the same fraction, and may resulting in the normal-state conductance (the reciprocal of the normal state resistance) increasing or decreasing by about the same fraction. For example, doubling the channel width from 1.5 microns to 3.0 microns (while maintaining the channel length unchanged) may result in a normal state resistance, when the voltage across the conductive gate 115 and the graphene channel is −5 V, of about 325 ohms, and a critical current, when the voltage across the conductive gate 115 and the graphene channel is +5 V, of about 3.4 microamperes.

In some embodiments, a plurality of graphene-based superconducting transistors are used in a cryogenic high performance computer, which may also be referred to as a system for cryogenic classical computation (as distinct from quantum computation) or cryogenic high performance computing.

Although limited embodiments of a graphene-based superconducting transistor have been specifically described and illustrated herein, many modifications and variations will be apparent to those skilled in the art. Accordingly, it is to be understood that a graphene-based superconducting transistor employed according to principles of this invention may be embodied other than as specifically described herein. The invention is also defined in the following claims, and equivalents thereof.

What is claimed is:
1. A transistor comprising:
a first superconducting source-drain,
a second superconducting source-drain, a graphene channel comprising at least a portion of a graphene sheet,
a conductive gate, and
a gate insulating layer,
the first superconducting source-drain, the second superconducting source-drain, and the graphene channel together forming a Josephson junction having a critical current,
the graphene channel forming a current path between the first superconducting source-drain and the second superconducting source-drain,
the conductive gate being a conductive sheet on the graphene channel, between the first superconducting source-drain and the second superconducting source-drain,
the gate insulating layer being between the conductive gate and the graphene channel, and
the conductive gate being configured, upon application of a voltage across the conductive gate and the graphene channel, when each of the first superconducting source-drain and the second superconducting source-drain is in a superconducting state and the graphene channel is in a normal state, to modify the critical current.

2. The transistor of claim 1, further comprising a graphene sandwich comprising:
a first layer of hexagonal boron nitride immediately adjacent a first surface of the graphene sheet,
the graphene sheet, and
a second layer of hexagonal boron nitride immediately adjacent a second surface of the graphene sheet.

3. The transistor of claim 2, wherein each of the first layer of hexagonal boron nitride and the second layer of hexagonal boron nitride has a thickness greater than 0.3 nm and less than 100 nm.

4. The transistor of claim 2, wherein the conductive gate is directly on the graphene sandwich.

5. The transistor of claim 2, wherein the gate insulating layer is directly on the graphene sandwich, and the conductive gate is directly on the gate insulating layer.

6. The transistor of claim 5, wherein the gate insulating layer is composed of aluminum oxide.

7. The transistor of claim 2, further comprising a substrate, the first superconducting source-drain, the second superconducting source-drain, and the graphene sandwich being on the substrate.

8. The transistor of claim 7, wherein the substrate is a silicon substrate.

9. The transistor of claim 8, wherein the substrate is a float zone crystalline silicon substrate.

10. The transistor of claim 1, wherein the graphene sheet has an electron mobility of more than 100,000 $cm^2/V/s$.

11. The transistor of claim 1, wherein the graphene sheet substantially has the shape of a rectangle, the rectangle having a length and a width, the length being less than or equal to the width.

12. The transistor of claim 11, wherein the length of the rectangle is less than 0.5 microns and the width of the rectangle is greater than 0.5 microns.

13. The transistor of claim 12, wherein the length of the rectangle is between 0.1 microns and 0.3 microns, and the width of the rectangle is between 0.7 microns and 2.5 microns.

14. The transistor of claim 1, wherein the graphene sheet consists of a single atomic layer of graphene.

15. The transistor of claim 1, wherein the graphene sheet comprises two atomic layers of graphene.

16. The transistor of claim 1, wherein the first superconducting source-drain and the second superconducting source-drain are composed of a material selected from the group consisting of niobium nitride, niobium titanium nitride, niobium diselenide, aluminum, niobium, niobium titanium, and lead.

17. A system comprising the transistor of claim 1, and further comprising a refrigerator configured to cool the graphene sheet to a temperature below 4 K.

18. The system of claim 17, wherein the refrigerator is a pulse tube refrigerator.

* * * * *